United States Patent [19]

Miller et al.

[11] Patent Number: 4,533,844
[45] Date of Patent: Aug. 6, 1985

[54] PEAK STORAGE AMPLIFIER

[75] Inventors: Ira Miller; Robert B. Davies, both of Tempe, Ariz.

[73] Assignee: Motorola, Inc., Schaumburg, Ill.

[21] Appl. No.: 694,895

[22] Filed: Jan. 24, 1985

Related U.S. Application Data

[63] Continuation of Ser. No. 352,904, Feb. 26, 1982, abandoned.

[51] Int. Cl.³ .......................... H03K 5/20; H03F 3/45
[52] U.S. Cl. ................................. 307/530; 307/352; 307/351; 330/257; 328/151
[58] Field of Search ............... 307/350, 351, 352, 531, 307/530, 358; 330/257, 288; 328/151, 150

[56] References Cited

U.S. PATENT DOCUMENTS

| | | | |
|---|---|---|---|
| 3,702,942 | 11/1972 | Aguirre | 307/352 |
| 4,219,782 | 8/1980 | Stein | 330/257 |
| 4,222,095 | 9/1980 | Stein | 307/261 |
| 4,321,488 | 3/1982 | Srivastava | 307/351 |
| 4,338,527 | 7/1982 | Nagamo | 307/494 |
| 4,410,859 | 10/1983 | Kuwahara | 330/257 |

*Primary Examiner*—Stanley D. Miller
*Assistant Examiner*—Timothy P. Callahan
*Attorney, Agent, or Firm*—William E. Koch

[57] ABSTRACT

A peak storage amplifier for storing successive peaks of a waveform for a sufficient period of time to insure accurate data transmittal is provided. A differential amplifier is responsive to the waveform and drives a PNP transistor that provides an output. A capacitor stores the peaks of the output waveform as long as a clamp signal is received by a current source that inhibits the current source from sinking the output to ground. Since the PNP transistor is continually reversed biased and the base-collector capacitance is small, the storage capacitor's discharge due to the amplifiers inherent turn-off characteristics is minimized. A compensation capacitor coupled to the differential amplifier prevents the collapse of a Wilson mirror serving as a load to the differential amplifier.

10 Claims, 1 Drawing Figure

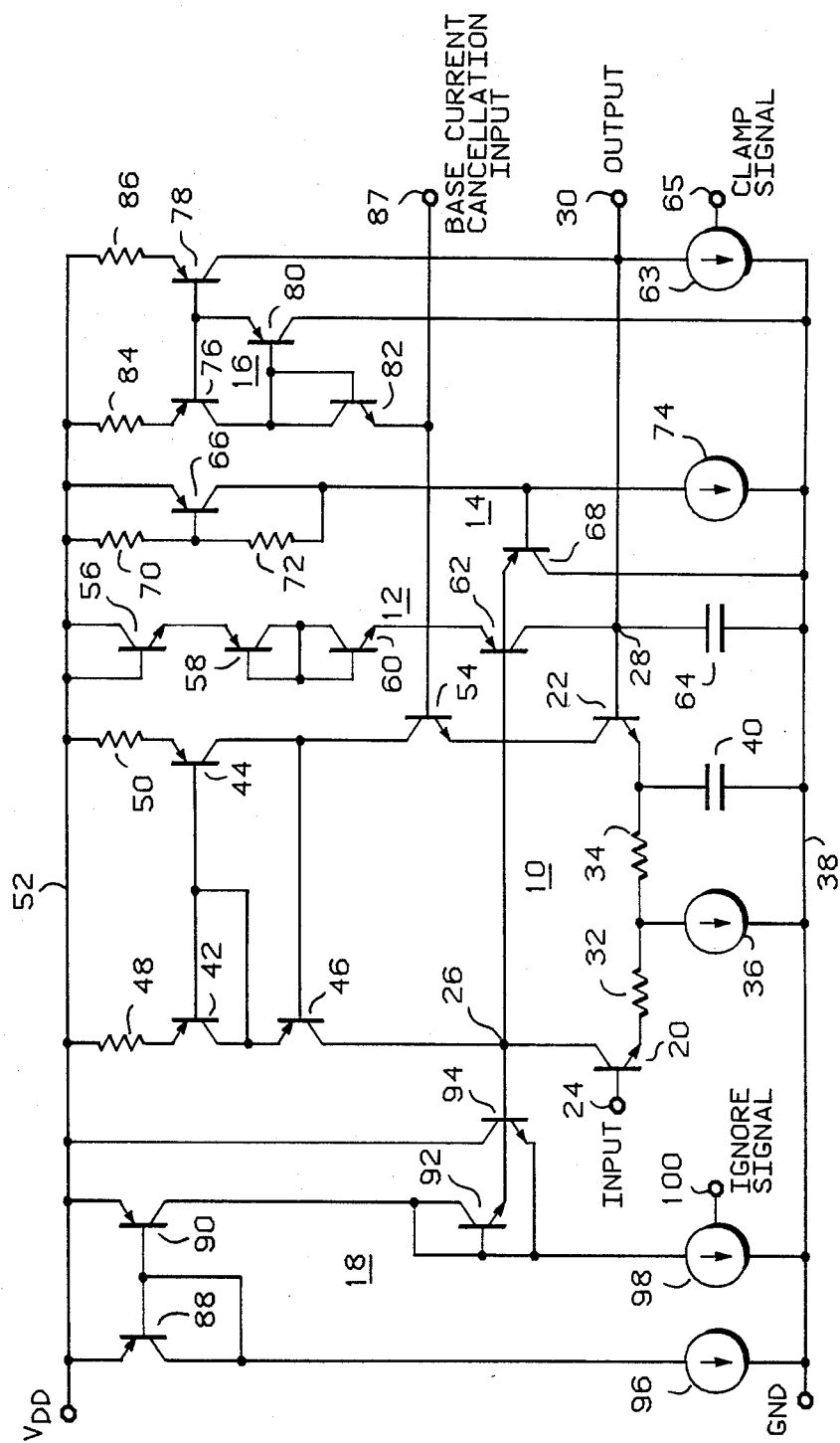

PEAK STORAGE AMPLIFIER

This application is a continuation, of application Ser. No. 352,904, filed Feb. 26, 1982, abandoned.

BACKGROUND OF THE INVENTION

1. Field of the Invention

This invention relates, in general, to storage amplifiers and more particularly to an amplifier that stores the peak voltage of a changing waveform.

2. Background Art

Systems having a bubble memory require a sense amplifier that converts the information stored magnetically in the bubble memory to a signal compatible with TTL circuitry. The bubbles are rotated through a magneto-resistive detector element. This detector element changes value when a magnetic domain, or bubble, passes underneath it. Since a constant current is being pulled through the detector, the changing resistance produces a voltage waveform. This waveform is supplied to the sense amplifier which converts the information to a digital signal.

Typically, sense amplifiers include a sample and hold circuit for storing the peak magnitude of the waveform for both the presence and absence of a bubble. The stored peak insures the proper voltage is "read" when interrogated.

Sample and hold circuits typically have a differential amplifier responsive to an input signal, and an output signal supplied to an NPN transistor that charges a storage capacitor through its emitter. Although this configuration is relatively fast, it introduces an error term when transition to the hold mode takes place. The base-emitter junction of the NPN transistor is reversed biased, thereby removing a charge quantity from the storage capacitor.

Another known configuration charges the storage capacitor through the collector of an NPN transistor while restricting the base swing. However, in this configuration a capacitor must switch from a coupling mode to an initialing mode, thereby producing spikes in the output. Both of these configurations have a small resolution between a "one" and a "zero", or the presence and absence of a bubble.

Thus, what is needed is a peak storage amplifier that reduces the discharge of a storage capacitor due to inherent characteristics of the circuit and reduces the response to noise.

SUMMARY OF THE INVENTION

Accordingly, it is an object of the present invention to provide an improved peak storage amplifier.

Another object of the present invention is to provide a peak storage amplifier wherein the error discharge of a storage capacitor due to circuit characteristics is reduced.

A further object of the present invention is to provide a peak storage amplifier whose informational output response to noise is reduced.

In carrying out the above and other objects of the invention in one form, there is provided an improved peak storage amplifier responsive to an input waveform for storing a peak magnitude of the input waveform, having an output means responsive to the input waveform and including a PNP transistor, for providing an output, a storing means coupled to the transistor for storing the output at the magnitude of the peak, and a means coupled to the output means for initialing the storing means.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the invention.

DETAILED DESCRIPTION OF THE INVENTION

Referring to the single FIGURE, a peak storage amplifier in accordance with the present invention includes differential amplifier 10, output stage 12, clamp level network 14, base current cancellation network 16, and current switch 18. Differential amplifier 10 comprises a differential pair of NPN transistors 20 and 22. Transistor 20 has its base connected to input terminal 24 for receiving an input waveform. The collector of transistor 20 is connected to node 26. The base of transistor 22 is connected to node 28 which is connected to output terminal 30. The emitters of transistors 20 and 22 are connected to one terminal of resistors 32 and 34, respectively. The remaining terminals of resistors 32 and 34 are commonly connected to differential amplifier current source 36 which provides a current path to ground rail 38. Compensation capacitor 40 is coupled between the emitter of transistor 22 and ground rail 38. A Wilson mirror comprising PNP transistors 42, 44, 46, and resistors 48, 50 provides the differential to single ended load for differential pair transistors 20 and 22. The emitters of transistors 42, and 44 are coupled to $V_{DD}$ rail 52 by resistors 48 and 50, respectively. The base of transistor 44 is connected to both the base and collector of transistor 42, and the emitter of transistor 46. The collector of transistor 44 is connected to the base of transistor 46 and the collector of NPN transistor 54. The emitter of transistor 54 is connected to the collector of transistor 22 and the collector of transistor 46 is connected to node 26 which is connected to the collector of transistor 20, thereby supplying the differential to single ended load for the differential pair transistors 20 and 22.

The differential amplifier 10 is a high impedance output transconductance amplifier having unity gain as a voltage follower. The input waveforms supplied at input terminal 24 is repeated at node 28, subject to the conditions to be explained hereinafter. Compensation capacitor 40 is coupled between the emitter of transistor 22 and ground rail 38 for preventing the Wilson mirror comprising transistors 42, 44, 46 from collapsing, or turning off, when transistor 22 is turned off. Capacitor 40 therefore prevents any delays associated with turning the Wilson mirror back on. More specifically, capacitor 40 slows down the rate of conductivity of transistor 22. Since current source 36 will conduct only a defined current, as the input signal at input terminal 24 increases causing transistor 20 to momentarily increase its conductivity, without capacitor 40 the current through transistor 22 would momentarily decrease. This lack of current through transistor 22 could cause the mirror comprising transistors 42, 44 and 46 to collapse. However, transistor 22 continues conducting by charging capacitor 40 during the momentary high conductivity state of transistor 20.

Output stage 12 comprises NPN transistors 56 and 60 and PNP transistors 58 and 62. The base and collector of transistor 56 are connected to $V_{DD}$ rail 52 and the emitter of transistor 56 is connected to the emitter of transistor 58. The base and collector of transistor 58 are both connected to the base and collector of transistor 60. The emitter of transistor 60 is connected to the emitter of PNP output transistor 62. The base and collector of transistor 62 are connected to nodes 26 and 28, respectively. Transistor 62 is biased according to the signal at node 26 which is controlled by the input waveform at terminal 24, thereby providing an output current at node 28. Current source 63 is coupled between node 28 and ground rail 38. Current source 63 is switched on and off by applying a current differential at clamp signal terminal 65 and serves as a current sink to discharge capacitor 64. Storage capacitor 64 is coupled between node 28 and ground rail 38 for storing the voltage at node 28 when current source 63 is off and holding that voltage after the input waveform at input terminal 24 begins a downward transition.

The high impedance output of differential amplifier 10 biases transistor 62. Capacitor 64 is charged from the collector of transistor 62. Since the collector-base junction of transistor 62 is always reversed biased by having node 26 more positive than node 28, and the capacitance between the collector and base is small, any glitch in the output caused by turning off PNP transistor 62 is minimized.

In summary, a positive input waveform at the base of transistor 20 pulls node 26 down thereby increasing the conductivity of transistor 62, pulling node 28 up and causing node 28 to follow input terminal 24. Current source 63 sinks a fixed current to ground rail 38. As the voltage at node 28 increases at a rate faster than current source 63 can sink, capacitor 64 will store the additional current. As the voltage at node 28 decreases, current source 63 will discharge capacitor 64. Therefore, when current source 63 is on, input terminal 30 follows the input at input terminal 24. However, when current source 63 is off, capacitor 64 stores the peak voltage at node 28 and output terminal 30 until current source 63 is turned on. As the voltage at node 28 increases, the charge on capacitor 64 increases. When a peak is reached, capacitor 64 holds that charge until a path is available for discharge, i.e., current source 63 is turned back on.

Clamp level network 14 comprises PNP transistors 66 and 68, resistors 70 and 72, and current source 74. The emitter of transistor 66 is connected to $V_{DD}$ rail 52 and the base is coupled to $V_{DD}$ rail 52 by resistor 70. Resistor 72 is coupled between the collector and base of transistor 66. The collector of transistor 66 is further connected to the base of transistor 68 and coupled to ground rail 38 by current source 74. The collector and emitter of transistor 68 are connected to ground rail 38 and node 26, respectively. Transistor 66, resistors 70, 72, and current source 74 establish a voltage at the base of transistor 68 whereby transistor 68 limits the positive going magnitude of node 26, preventing transistor 46 from saturating.

Bias current cancellation network 16 comprises PNP transistors 76, 78, 80 NPN transistor 82, and resistors 84, 86 and serves the purpose of ensuring that the base current of transistor 22 does not cause capacitor 64 to discharge thereby producing an error in the peak value stored in capacitor 64. The emitters of transistors 76 and 78 are coupled to $V_{DD}$ rail 52 by resistors 84 and 86, respectively. The base of transistor 76 is connected to both the base of transistor 78 and the emitter of transistor 80. The collector of transistor 80 is connected to ground rail 38 and the collector of transistor 78 is connected to node 28. The collector of transistor 76 is connected to the base of both transistors 80 and 82 and the collector of transistor 82. The emitter of transistor 82 is connected to the base of transistor 54 of the differential amplifier circuit 10 and base current cancellation input terminal 87. Transistors 76, 78 and 80 serve as a mirror and transistor 82 establishes the bias level. The base current of transistor 54 substantially equals that of transistor 22; therefore, the base current supplied to transistor 54 is duplicated or mirrored from the collector of transistor 78 and summed at node 28 with the base current from transistor 22, thereby cancelling the subtraction of the base current to transistor 22 from the output at node 28.

Current switch 18 comprises PNP transistors 88, 90, NPN transistors 92, 94 and current sources 96, 98 and serves to disable the differential amplifier 10. The emitters of transistors 88 and 90 are connected to $V_{DD}$ rail 52 and the bases of transistors 88 and 90 are both connected to the collector of transistor 88. Current source 96 is coupled between the collector of transistor 88 and ground rail 38. The collector of transistor 90 is connected to the collector and base of transistor 92, the emitter of transistor 94, and one terminal of current source 98. The other terminal of current source 98 is connected to ground rail 38. The emitter of transistor 92 is connected to the base of transistor 94 and node 26. The collector of transistor 94 is connected to $V_{DD}$ rail 52. Current source 98 is switched on and off by applying a current differential at ignore signal terminal 100. When current source 98 is off, current from transistor 90 turns on transistor 92 supplying current to node 26, thereby forward biasing transistor 68. Transistor 68 holds single ended output node 26 low thereby inhibiting any output from amplifier 10 without actually shutting off amplifier 10. This allows amplifier 10 to remain active and prevents start-up glitches. However, when the current of current source 98 is greater than the current mirrored by transistors 88 and 90, transistor 94 acts as a follower holding transistor 92 in a reverse biased or off configuration thereby allowing amplifier 10 to operate normally.

Current switch 18 furthermore serves to reduce any error current introduced at node 26 by PNP transistor 62. When current source 98 is on, transistor 92 is biased off and transistor 94 is biased on by current from node 26. The current biasing transistor 94 on substantially reduces the current supplied to node 26 from the base of transistor 62.

In addition to being used as a peak storage amplifier, the invention just described may also be used as a sample and hold circuit. If current source 63 and 98 are both turned off, capacitor 64 will store the voltage at node 28 at the instant they are turned off and maintain that voltage at output terminal 30. The voltage at node 28 reflects the voltage at node 26 which in turn is controlled by input terminal 24.

By now it should be appreciated that there has been provided an improved peak storage amplifier. This peak storage amplifier reduces the discharge of a storage capacitor due to circuit characteristics and also reduces response to glitches in the input since the output PNP transistor 62 is slow to respond to fast transitions of the input.

We claim:

1. A peak storage amplifier for storing a peak amplitude of an input waveform, comprising:
   output means for providing an output at an output terminal, comprising:
      a first PNP transistor having an emitter coupled to a first voltage conductor and a collector coupled to said output terminal;
      a first switching device having a control electrode coupled to receive said input waveform, a first current carrying electrode coupled to a node, and a second current carrying electrode coupled to a base of said first PNP transistor, said node coupled to a second voltage conductor;
      a second switching device having a control electrode coupled to to said collector of said first PNP transistor, and a first current carrying electrode coupled to said node;
      a first mirror network coupled between said first voltage conductor and both said second current carrying electrode of said first switching device and a second current carrying electrode of said second switching device; and
      preventing means coupled between said first current carrying electrode of said second switching device and said second voltage conductor for preventing said first mirror network from turning off;
   storing means coupled between said collector of said first PNP transistor and said second voltage conductor for storing said output at the amplitude of said peak; and
   enabling means coupled to said storing means and coupled to receive an enabling signal for enabling said storage means.

2. The peak storage amplifier according to claim 1 further comprising a clamp level network coupled to said base of said first PNP transistor for clamping said output of said amplifier below an operating threshold.

3. The peak storage amplifier according to claim 1 further comprising a current switch coupled to said second current carrying electrode of said first switching device for biasing said first switching device so that said output means will selectively respond to said input waveform.

4. The peak storage amplifier according to claim 1 wherein said first and second switching devices respectively comprises:
   a first NPN transistor having a base coupled to receive said input waveform, an emitter coupled to said node, and a collector coupled to said first mirror network and said base of said first PNP transistor; and
   a second NPN transistor having a base coupled to said output terminal, an emitter coupled to said node and said preventing means, and a collector coupled to said first mirror network.

5. The peak storage amplifier according to claim 4 wherein said preventing means comprises a capacitor having a first terminal coupled to the emitter of said second NPN transistor and having a second terminal coupled to said second voltage conductor.

6. The peak storage amplifier according to claim 5 wherein said output means further comprises:
   a first degeneration resistor coupled between the emitter of said first NPN transistor and said node; and
   a second degeneration resistor coupled between said emitter of said second NPN transistor and said node.

7. The peak storage amplifier according to claim 2 wherein said clamp level network comprises a second PNP transistor having a base coupled to establishing means for establishing a first threshold voltage, an emitter coupled to the base of said first PNP transistor, a collector coupled to said second voltage conductor.

8. The peak storage amplifier according to claim 1 further including a base current cancellation network comprising:
   a second mirror network coupled to said first voltage conductor and having a second mirror input terminal and a second mirror output terminal;
   a bias setting device coupled to said second mirror input terminal and coupled to receive a base current cancellation input; and
   a second NPN transistor coupled between said second current carrying electrode of said second switching device and said first mirror network, wherein a base is coupled to receive said base current cancellation input, an emitter is coupled to said current carrying electrode of said second switching device, and a collector is coupled to said first mirror network.

9. A peak storage amplifier for storing a peak amplitude of an input waveform, comprising:
   output means for providing an output at an output terminal, said output means comprising:
      a first mirror network coupled to a first voltage conductor and having a first and a second load conductor,
      a differential pair of switching devices including a first NPN transistor having a base coupled to receive said input waveform, an emitter coupled to a node, and a collector coupled to said first load conductor, and a second NPN transistor having a base coupled to said output terminal, an emitter coupled to said node, said node coupled to a second voltage conductor,
      a capacitor coupled between the emitter of said second NPN transistor and said second voltage conductor, and
      a first PNP transistor having a base coupled to the collector of said first NPN transistor, an emitter coupled to said first voltage conductor, and a collector coupled to said output terminal;
   storing means coupled between said collector of said first PNP transistor and said second voltage conductor for storing said output at the magnitude of each of said peaks;
   a second PNP transistor having a base coupled to said first voltage conductor, an emitter coupled to said base of said first PNP transistor, a collector coupled to said second voltage conductor;
   a current switch for biasing said differential pair of switching devices comprising:
      a second mirror network coupled to said first voltage conductor and having a second mirror input and a second mirror output, said second mirror input coupled to said second voltage conductor,
      a third NPN transistor having a base and collector coupled to said second mirror output, and
      a fourth NPN transistor having a base coupled to the emitter of said third NPN transistor and the collector of said first NPN transistor, a collector coupled to said first voltage conductor, an emitter coupled to said second voltage conductor;
a base current cancellation network comprising:
a third mirror network coupled to said first voltage conductor and having a third mirror input and a third mirror output,
a bias setting means coupled to a base current cancellation input and said third mirror input, and
a fifth NPN transistor having a base coupled to said base current cancellation input, an emitter coupled to the collector of said second NPN transistor, and a collector coupled to said second load conductor; and
enabling means coupled to said storing means for enabling said storage means.

10. A peak storage amplifier for a bubble sense amplifier, said peak storage amplifier coupled to a bubble detector element of a bubble memory system and responsive to an input waveform representative of the presence or absence of magnetic bubbles, for storing a peak amplitude of the input waveform, comprising:
a mirror network coupled to a voltage conductor for providing a load;
a differential pair of switching devices coupled to said mirror network and responsive to said input waveform;
a PNP transistor having a base, emitter, and collector, said base coupled to said differential pair of switching devices, said emitter coupled to said voltage conductor, and said collector providing an output;
capacitive means coupled to said differential pair of switching devices for preventing said first mirror network from turning off;
storing means coupled to said collector for storing said output at the amplitude of said peak; and
inhibiting means coupled to said storing means for inhibiting said storing means.

* * * * *